United States Patent
Hynecek

(10) Patent No.: US 8,471,310 B2
(45) Date of Patent: Jun. 25, 2013

(54) IMAGE SENSOR PIXELS WITH BACK-GATE-MODULATED VERTICAL TRANSISTOR

(75) Inventor: Jaroslav Hynecek, Allen, TX (US)

(73) Assignee: Aptina Imaging Corporation, George Town (KY)

( * ) Notice: Subject to any disclaimer, the term of this patent is extended or adjusted under 35 U.S.C. 154(b) by 218 days.

(21) Appl. No.: 13/004,338

(22) Filed: Jan. 11, 2011

(65) Prior Publication Data

US 2012/0175497 A1 Jul. 12, 2012

(51) Int. Cl.
*H01L 21/02* (2006.01)
*H01L 27/148* (2006.01)

(52) U.S. Cl.
USPC ............ 257/290; 257/292; 257/293; 257/223

(58) Field of Classification Search
USPC .................................................. 257/290, 292
See application file for complete search history.

(56) References Cited

U.S. PATENT DOCUMENTS

| | | | |
|---|---|---|---|
| 5,202,907 A | 4/1993 | Yonemoto | |
| 5,285,091 A * | 2/1994 | Hamasaki | .................... 257/292 |
| 5,566,044 A * | 10/1996 | Bergemont et al. | ......... 361/321.1 |
| 5,625,210 A | 4/1997 | Lee et al. | |
| 5,825,056 A * | 10/1998 | Yonemoto | ....................... 257/290 |
| 5,861,645 A * | 1/1999 | Kudo et al. | ....................... 257/291 |
| 6,351,284 B1 * | 2/2002 | Watanabe et al. | .............. 348/312 |
| 6,657,665 B1 | 12/2003 | Guidash | |
| 7,750,964 B2 | 7/2010 | Hirota et al. | |
| 2008/0151091 A1 * | 6/2008 | Hynecek | ........................ 348/308 |
| 2008/0283886 A1 * | 11/2008 | Hynecek | ........................ 257/292 |

* cited by examiner

*Primary Examiner* — Ha Tran T Nguyen
*Assistant Examiner* — Dzung Tran
(74) *Attorney, Agent, or Firm* — Treyz Law Group; Jason Tsai

(57) ABSTRACT

Image sensor arrays may include image sensor pixels each having at least one back-gate-modulated vertical transistor. The back-gate-modulated vertical transistor may be used as a source follower amplifier. An image sensor pixel need not include an address transistor. The image sensor pixel with the back-gate-modulated vertical source follower transistor may exhibit high fill factor, large charge storage capacity, and has as few as two row control lines and two column control lines per pixel. This can be accomplished without pixel circuit sharing. The pixel may also provide direct photo-current sensing capabilities. The ability to directly sense photo-current may facilitate fast adjustment of sensor integration time. Fast adjustment of sensor integration time may be advantageous in automotive and endoscopic applications in which the time available for the correction of integration time is limited.

21 Claims, 6 Drawing Sheets

IMAGE SENSOR PIXELS WITH BACK-GATE-MODULATED VERTICAL TRANSISTOR

BACKGROUND

Typical complementary metal-oxide-semiconductor (CMOS) image sensors sense light by converting impinging photons into electrons that are integrated (collected) in sensor pixels. Once the integration cycle is complete, collected charge is converted into a voltage signal, which is supplied to output terminals of an image sensor. This charge to voltage conversion is performed within each sensor pixel. The pixel output voltage (i.e., an analog voltage signal) is transferred to the output terminals using various pixel addressing and scanning schemes. The analog voltage signal can also be converted on-chip to a digital equivalent before reaching the chip output.

The sensor pixels include buffer amplifiers (i.e., source followers) that drive sensing lines connected to the pixels through address transistors. After the charge to voltage conversion and after the resulting voltage signal has been read out from the pixels, the pixels are reset in preparation for a successive charge accumulation cycle. In pixels that include floating diffusions (FD) serving as charge detection nodes, the reset operation is performed by turning on a reset transistor that connects the floating diffusion node to a voltage reference.

Removing charge from the floating diffusion node using the reset transistor, however, generates kTC-reset noise as is well known in the art. The kTC noise must be removed using correlated double sampling (CDS) signal processing technique in order to achieve desired low noise performance. Typical CMOS image sensors that utilize CDS require at least four transistors (4T) per pixel. An example of the 4T pixel circuit with a pinned photo-diode can be found in Lee (U.S. Pat. No. 5,625,210), incorporated herein as a reference.

In modern CMOS image sensor designs, circuitry associated with multiple photo-diodes may be shared, as can be found for example in Guidash (U.S. Pat. No. 6,657,665). In Guidash, a sensor pixel consists of two photo-diodes located in neighboring rows. The two photo-diodes located in the neighboring rows share the same circuitry. Sharing circuitry in this way can result in having only two metal bus lines in the row direction and two metal bus lines in the column direction per photo-diode, as shown in FIG. 1.

This is useful for designing small pixels or pixels with high fill factor (FF), because the minimum pixel size is dependent on the spacing and width of the metal bus lines. This is also illustrated in FIG. 1, where drawing 100 represents the schematic diagram of a shared circuit pixel with two photo-diodes 107 and 108. Photo-diodes 107 and 108 are coupled to common floating diffusion charge detection node 115 through charge transfer transistors 109 and 110. FD node 115 is connected to the gate of source follower (SF) transistor 112. SF transistor 112 has a drain that is connected to Vdd column bus line 101 (i.e., a positive power supply line on which positive power supply voltage Vdd is provided) via line 116. SF transistor 112 has a source that is connected to output signal column bus line 102 via address (Sx) transistor 113 and line 117.

FD node 115 is reset using transistor 111. Reset transistor 111 has a drain that is connected to line 116 and a source that is connected to node 115. Address transistor 113, reset transistor 111, and charge transfer transistors 109 and 110 are controlled using control signals supplied over row bus lines 114, 106, 104, and 105, respectively.

As shown in FIG. 1, the circuit that has two photo-diodes. This particular image sensor therefore has two row bus lines and two column bus lines per photo-diode. In many cases, however, it is also necessary to provide an additional connection between transistor 110 and FD node 115, as indicated by wire 103. This additional connection reduces the pixel fill factor.

Because reset transistor 111 is connected to supply line 101, the photo current drained from FD node 115 is mixed with the drain current flowing through SF transistor 112 and thus cannot be detected. This represents a disadvantage because the photo current corresponds to a sensor illumination intensity, which is often used to adjust the pixel charge integration time (for preventing pixel charge overflow). In standard configurations that lack direct photo current detection, the sensor array has to be read out several times, and a correct integration time is determined using a suitable search algorithm. This procedure consumes valuable time that may not be available in applications such as the automotive or endoscopic imaging.

It would therefore be desirable to be able to provide image sensors with photo current sensing capabilities.

DETAILED DESCRIPTION

Figure 2A:
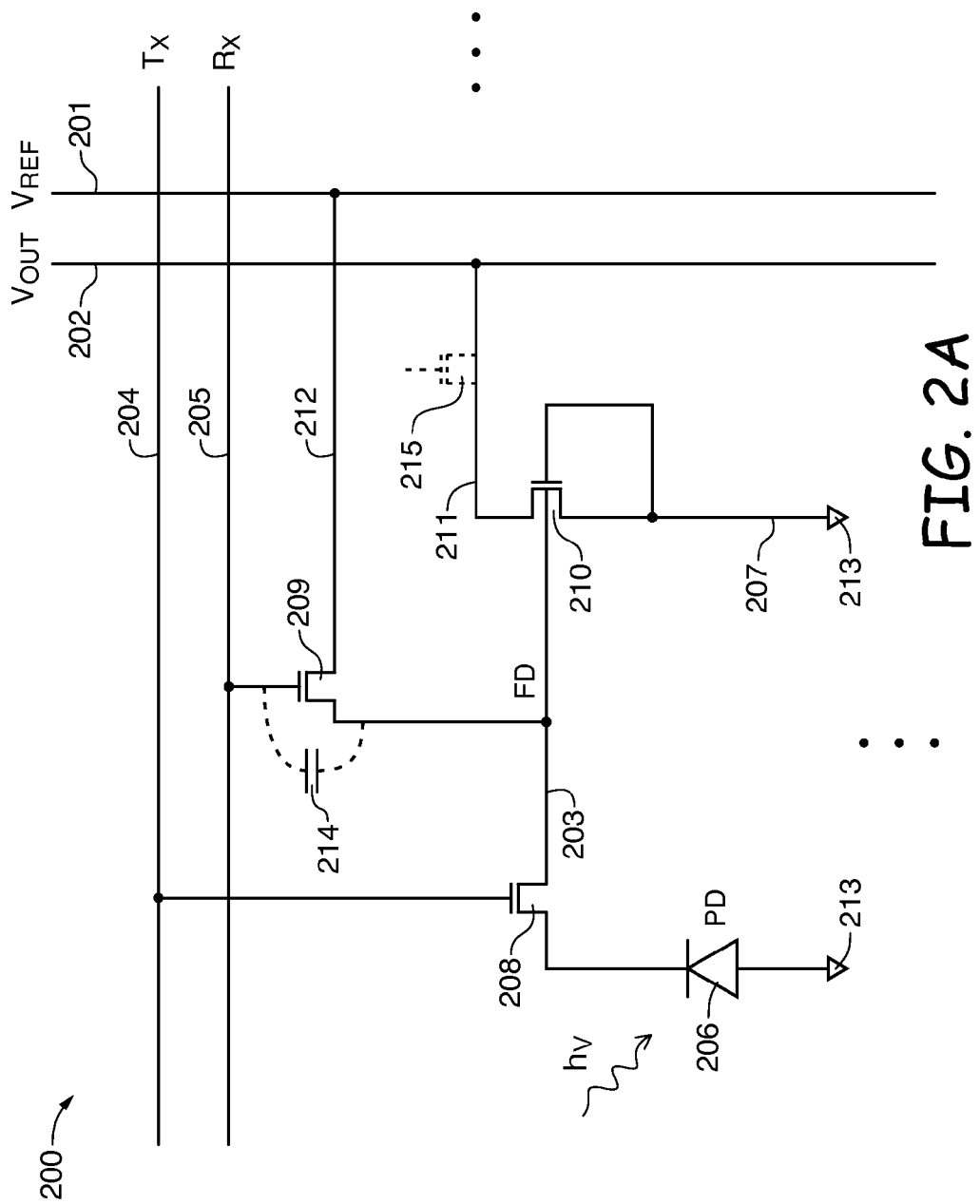
FIG. 2A is a schematic diagram of a pixel circuit that includes a back-gate-modulated vertical transistor in accordance with an embodiment of the present invention.

In FIG. 2A, drawing 200 is a circuit diagram of a pixel circuit that includes a back-gate-modulated vertical source follower (SF) transistor. The pixel circuit may be replicated across multiple rows and columns to form an image sensor pixel array, as indicated by the dotted circles in FIG. 2A. As shown in FIG. 2A, the pixel circuit includes a photosensitive element such as photo-diode 206. Photo-diode 206 may be referenced to a substrate such as p-type substrate 213. The pixel circuit may also include charge transfer transistor 208 and vertical SF transistor 210. Transistor 208 may serve to transfer charge from photo-diode 206 to floating diffusion (FD) charge detection node 203. FD region 203 (e.g., an n-type doped region) may serve as a bulk region for vertical SF transistor 210.

Floating diffusion node 203 may be reset using transistor 209. FD region 203 may also serve as a first source-drain region (sometimes referred to as a source region or a drain region) for reset transistor 209. The terms source and drain may sometimes be used interchangeably. Transistor 209 may have a second source-drain region coupled to reference voltage bias line 201 (e.g., a reference line on which column reference voltage Vref is provided) through line 212. Transistors 208 and 209 may have gate regions (sometimes referred to as gates or gate terminals) that receive control signals from array peripheral circuits via row bus lines 204 and 205, respectively. Asserting the control signals on row bus line 205 may reset the floating diffusion detection node.

When the reset transistor 209 is turned on, it is possible to directly monitor photocurrent, because column bus line 201 does not supply any current to SF transistor 210. This direct photocurrent sensing capability may be desirable for adjusting the array exposure time without performing full array scanning as required in the prior art.

Figure 1:
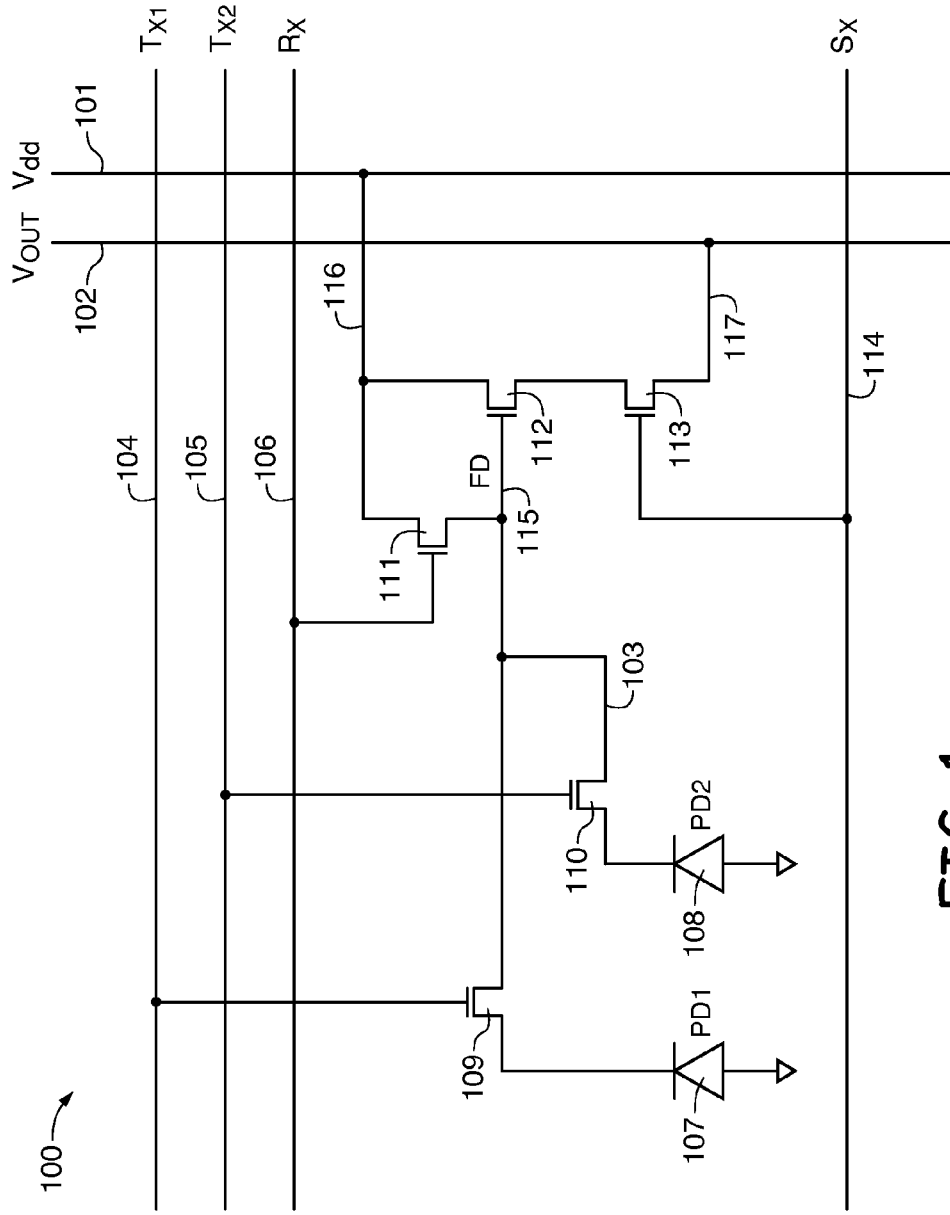
FIG. 1 is a schematic diagram of a conventional pixel circuit with two pinned photo-diodes that share addressing and reset circuitry.

In contrast to the conventional pixel circuit described in connection with FIG. 1, the pixel circuit of FIG. 2A does not have a dedicated addressing transistor. Addressing all pixels in a given row may be accomplished by resetting the pixels to predetermined voltage values. If desired, an address transistor such as address transistor 215 in FIG. 2A may be coupled between the source of SF transistor 210 and line 202 (e.g., the source of SF transistor 210 may be coupled to line 202 through the address transistor). Including the address transistor may introduce an additional row bus line on which address signals may be conveyed to turn on and turn off the address transistor.

SF transistor 210 may, for example, be a p-channel transistor (e.g., a p-channel metal-oxide-semiconductor transistor, a p-channel junction field-effect transistor, or other types of transistors). P-channel transistor 210 may be turned off when its back-gate bias is high and turned on when its back-gate bias is low. In practice, multiple SF transistors 210 may be coupled to common output line 202 via respective lines 211. As a result, a selected SF transistor in a column of pixel circuits with the lowest back-gate bias will be enabled.

For example, consider a scenario in which reset transistor 209 of an addressed row is turned off after resetting the SF transistor body to a low value, whereas reset transistors 209 of the remaining unaddressed rows are turned on while the reference voltage is kept high. In this scenario, only SF transistors 209 of the addressed row will be turned on to receive charge transferred from photo-diode 206 (e.g., charge from photo-diode 206 will be transferred to the bulk region of transistor 210). The photo-generated charge from photo-diode 206 may modulate the threshold voltage of SF transistor 210. SF transistor 210 may have a source connected to line 202 and a drain and gate connected to array substrate 213 through connection 207 (e.g., connection 207 may be a p+ doped region that does not have any metal lines and contact openings).

The back gate (e.g., the n-type bulk region) of transistor 210 may serve as the floating diffusion node, a source-drain terminal for transistor 208, and a source-drain terminal for transistor 209. Metal wiring and contact openings to the FD node need not be formed at the FD node, because the FD charge detection node, the back-gate terminal of transistor 210, and the source-drain terminals of transistors 208 and 209 have been merged together. This saves valuable pixel area as well as minimizes the possibility of leakage currents that may sometimes be generated as a result of defective contacts and FD regions with high impurity dopant concentrations.

Figure 2B:
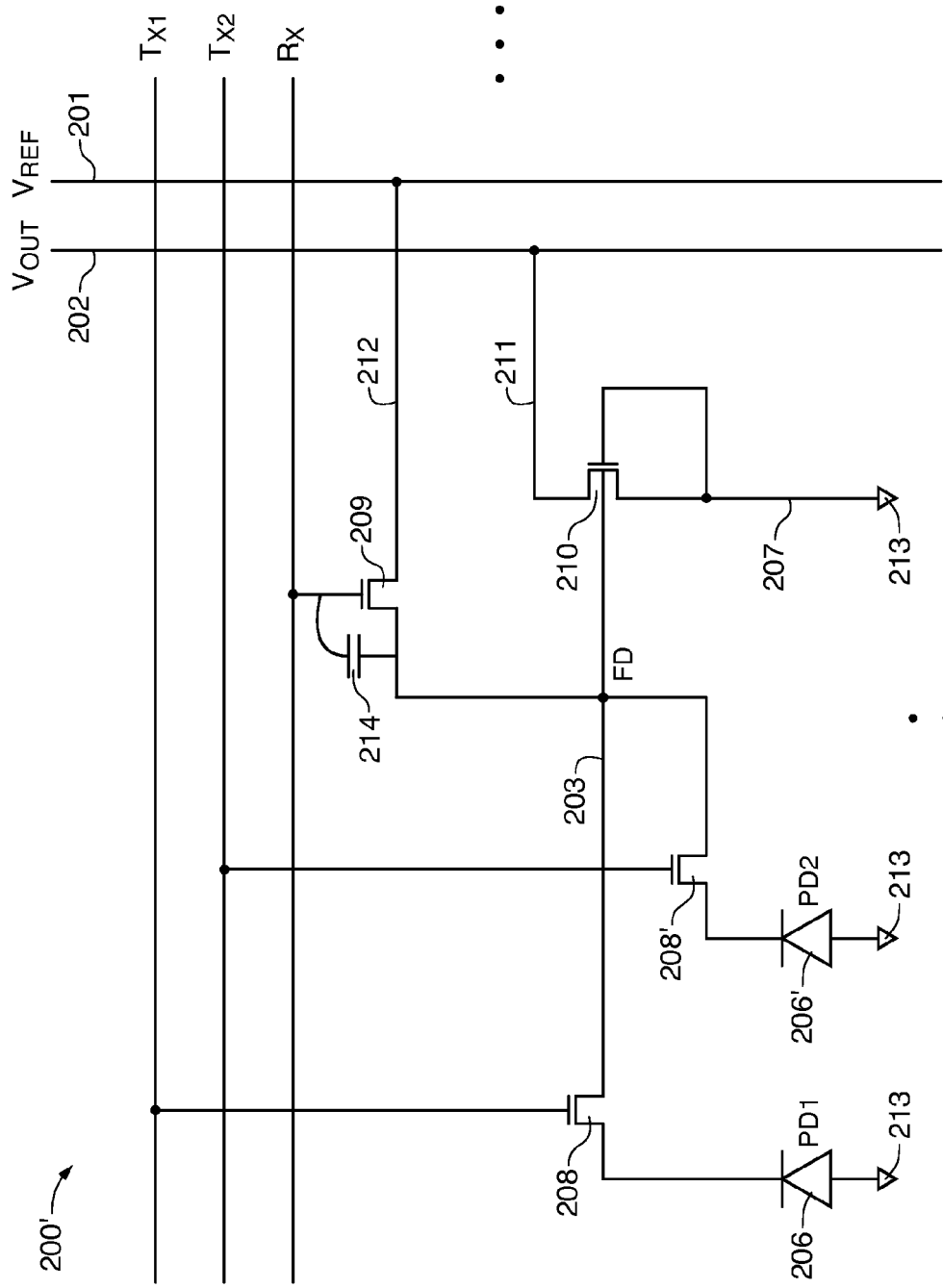
FIG. 2B is a schematic diagram of a pixel circuit that includes a back-gate-modulated vertical transistor shared between two photo-diodes devices in accordance with an embodiment of the present invention.

There are many modifications possible to the invention and to the particular embodiment described in connection with FIG. 2A. If desired, the pixel circuits (e.g., reset transistor, charge transfer gate, vertical SF transistor, etc.) may be shared among multiple photo-diodes, as is well known to those skilled in the art. In FIG. 2B, for example, the vertical SF transistor may be shared between first photo-diode 206 and second photo-diode 206'. Photo-diodes 206 and 206' may be coupled to the body region of the SF transistor through transfer gates 208 and 208', respectively.

Figure 3:
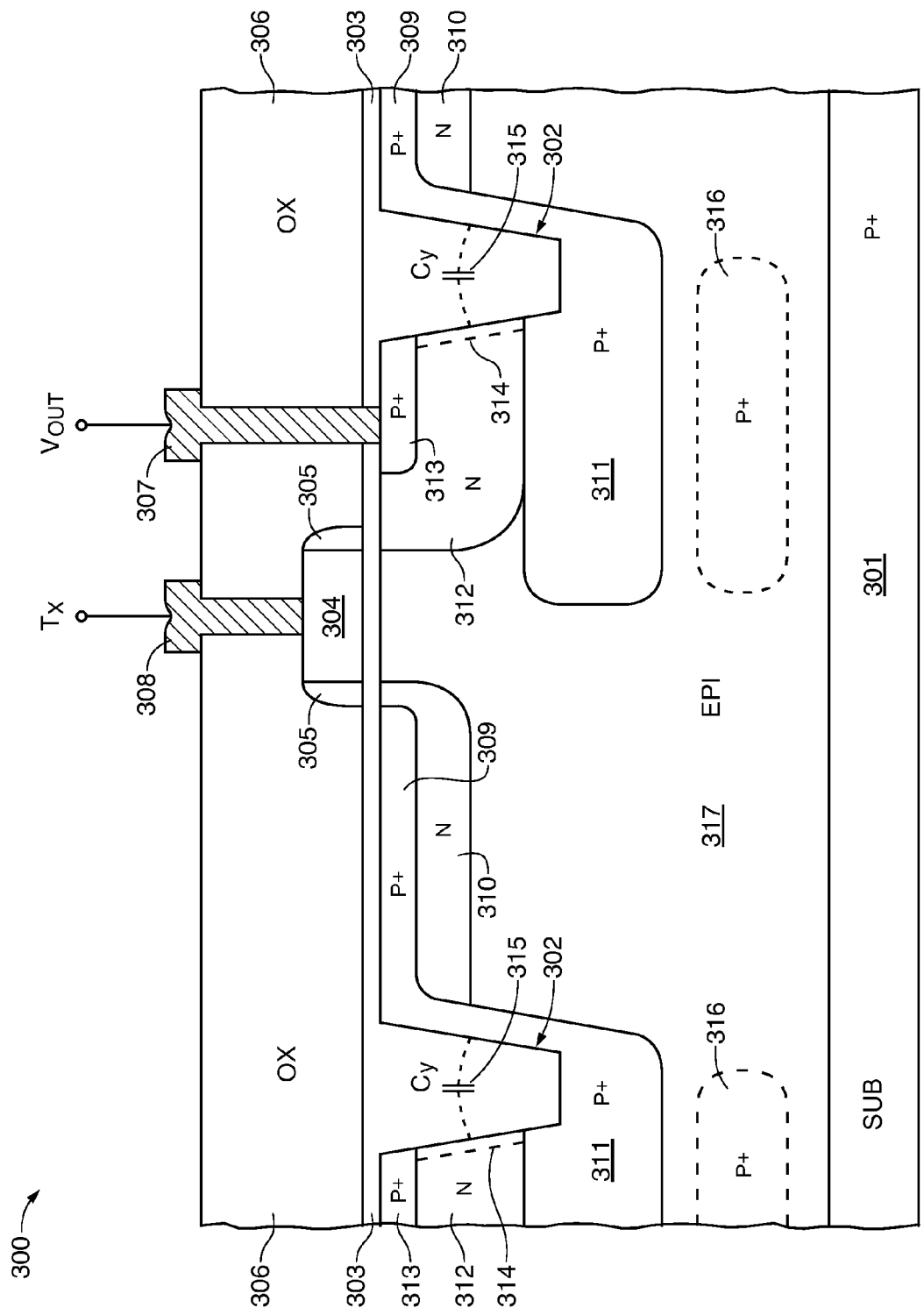
FIG. 3 is a cross-sectional side view of the pixel circuit of FIG. 2A in accordance with an embodiment of the present invention.

In FIG. 3, a simplified drawing 300 of the pixel cross section is shown. As shown in the drawing, a p-type doped silicon epitaxial layer 317 may be formed over p+ substrate 301. Each pair of adjacent pixels may be separated by shallow trench isolation (STI) regions such as STI regions 302. STI regions 302 may be filled with silicon dioxide that also extends over the surface of the device to form a thin gate oxide layer 303. Polysilicon gate 304 may be deposited and patterned on top of gate oxide layer 303 to form the gate region for charge transfer transistor 208. For simplicity, the reset transistor is not shown in FIG. 3.

Gate 304 may have sidewall isolation structures 305 (sometimes referred to as spacers) formed on each side of gate 304. Spacers 305 may serve as a self aligned mask for ion implantation during device fabrication processes. Another oxide layer 306 and other interconnect dielectric layers (not shown in drawing 300) are typically deposited over the entire sensor array to serve as isolation layers for metal interconnect wiring. Other materials such as silicon nitride may also be formed over the surface of the sensor array to serve as anti-reflection (AR) coating layers for improving pixel quantum efficiency (QE).

Conductive contact vias 307 and 308 may connect the first metal level wiring transfer gate 304 and to the source 313 of transistor SF, respectively. Additional connections may be formed in a second metal level and other metal levels to form desired metal routing. Source 313 forms an upper (unburied) source-drain terminal for the vertical SF transistor.

Photo-diode 206 of FIG. 2A is formed by the p+ doped pinning layer 309 (e.g., a p-type layer formed at the surface of the substrate) and n-type doping layer 310. Charge generated by impinging photons may be collected at region 310. As shown in FIG. 3, layer 309 may extend along the entire surface of the photo-diode and may extend under STI structures 302. Parts of layer 309 may also form a buried p+ doped region 311 that extends under the vertical p-channel SF transistor to serve as the drain (i.e., the lower one of the two source-drain terminals of the vertical SF transistor).

The vertical SF transistor may have a buried vertical channel region such as channel 314 that is doped with suitable p-type and n-type impurity concentrations to adjust its threshold voltage. The gate of the vertical SF transistor may be formed by the p+ doped layer at the opposite edge of the STI structure. The gate and the drain regions of the SF transistor are contiguous and may be electrically connected to substrate 301 (e.g., the gate and drain terminals of the SF transistor may be shorted to ground).

The vertical SF transistor may have a gate oxide thickness that is approximately equal to the width of the associated STI structure and may have a channel length that is approximately equal to the depth of the associated STI structure. Since the gate oxide thickness of the vertical SF transistor is relatively large (e.g., the width of STI structure 302 is large compared to the thickness of layer 303), SF transistor gate capacitance 315 is low. A low capacitance 315 may result in high sensitivity to potential changes at the bulk terminal of the vertical SF transistor. The SF transistor may therefore have a high gain approaching unity. The vertical SF transistor may have a back gate that is formed by n-type doped region 312, which also forms the FD region and the sources for the reset and charge transfer transistors.

P+ doped region 316 may be implanted in layer 317 to improve the connection between the drain of the vertical SF transistor and substrate 301, if desired. This additional implant may also reduce pixel cross talk by preventing photo-generated carriers from diffusing from one pixel to another.

FIGS. 2 and 3 are merely illustrative. While in this embodiment, the collected photo-generated charge are electrons and epitaxial substrate is p-type doped, one skilled in the art can reverse the doping from p-type to n-type and vice versa for the respective regions so that photo-generated holes may be collected instead of electrons. If desired, the substrate may be maintained p+ type doped, whereas the pinned photo-diode is formed using n+ doped surface layer 309 and p-type doped charge collection layer 310. In such an embodiment, the vertical SF transistor may be an n-channel transistor that detects photo-generated holes transferred into its back gate (bulk) region 312, which is a p-type doped region in this example. In this example, however, it may be necessary to provide additional wire connection to the n-channel drain region, which is now n-type doped.

The pixel cross-section of FIG. 3 is based on a front-side-illumination implementation (e.g., an arrangement in which light enters the image sensor from the side of the substrate on which the metal interconnects are formed). If desired, the back-gate-modulated source follower transistor may be used in a back-side-illuminated scheme (e.g., an arrangement in which light enters the image sensor from the side opposite the surface of the substrate on which the metal interconnects are formed).

Figure 4:
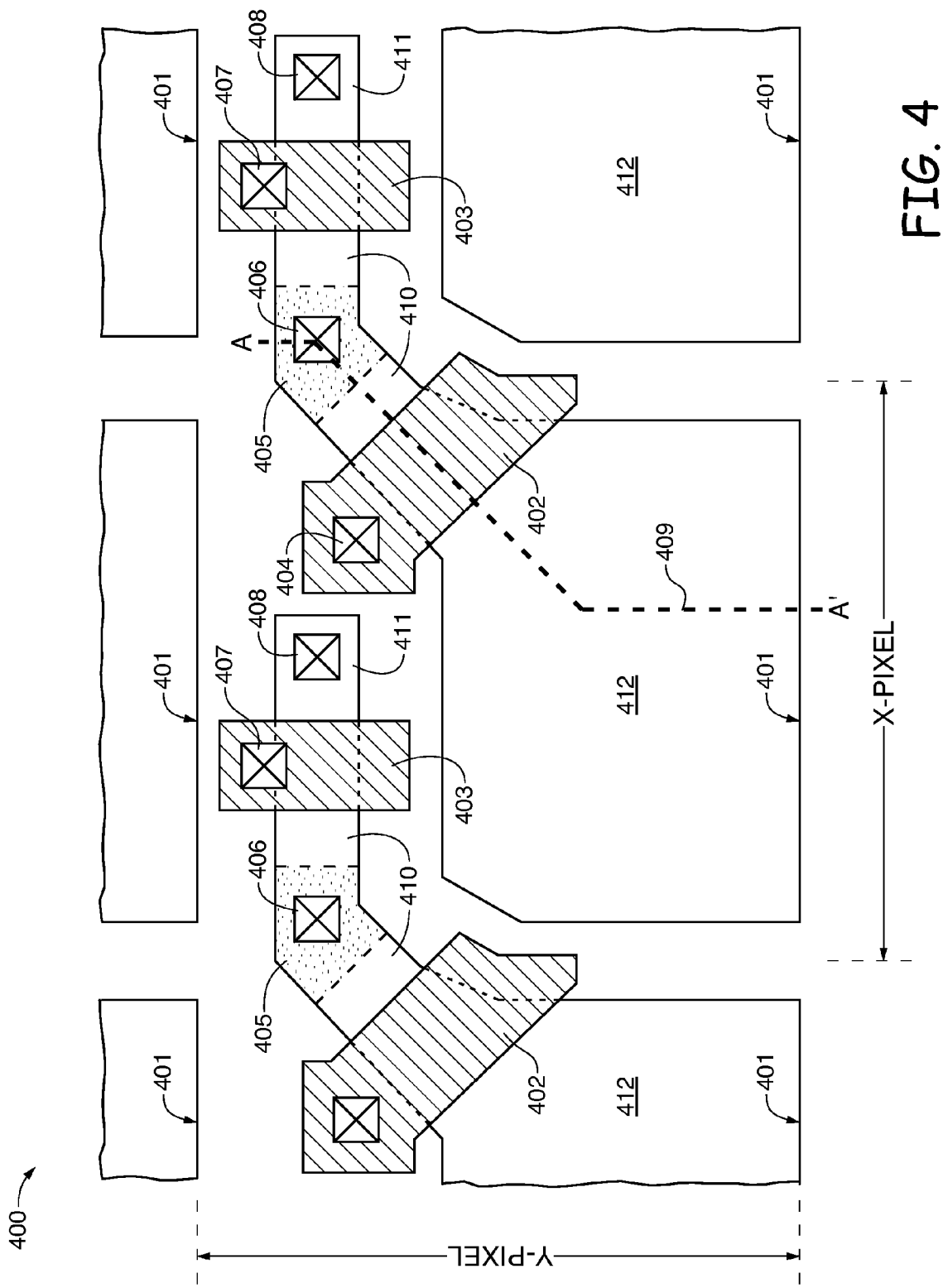
FIGS. 4 and 5 are top layout views of the pixel circuit of FIG. 2A in accordance with an embodiment of the present invention.

For more clarity, a simplified drawing of the pixel floor plan is shown in FIG. 4. Drawing 400 shows one pixel and portions of its neighboring pixels within an array of pixels. The array may include any number of pixels (e.g., the array may include N by M pixels), various peripheral addressing and driver circuits, analog-to-digital signal converters, reference voltage generators, constant current biasing circuits, etc.

As shown in FIG. 4, drawing 400 shows the geometric layout of active regions 401. Cut 409 (e.g., the dotted line connecting point A to A') indicates the detailed pixel cross section shown in FIG. 3. Polysilicon gate 402 is the charge transfer gate, whereas polysilicon region 403 is the reset transistor gate. Gate structures 402 and 403 may be formed using metal or other suitable types of conductive structures.

Region 405 is the p+ source region of the vertical SF transistor. Regions 410 interposed between the vertical SF transistor source and polysilicon gates 402 and 403 may be n-type doped. N+ region 410 may extend under region 405 as a contiguous n-type doped region to form the back gate of the vertical SF transistor and the floating diffusion region (see, e.g., FIG. 3). N+ region 411 may serve as the drain for the reset transistor. Photo-diode 412 may be formed in the remainder of active region 401, which has p+ type doping layer at the surface of the substrate and an underlying n-type doping region for charge collection.

Drawing 400 also shows the placement of contact region 404 to transfer gate 402 of the charge transfer transistor, contact region 406 to the source of the vertical SF transistor, contact region 407 to gate 403 of the reset transistor, and contact region 408 to the drain of the reset transistor. No contact is formed at floating diffusion region 410 (see, e.g., FIG. 4). Other pixel structures such as the gate spacers, metal interconnects, color filter layers, anti-reflection coating layers, and microlenses have been omitted for the simplicity of the drawing. The microlenses may be placed above the pixel array such that light is focused approximately at the center of each photo-diode region 412.

Figure 5:
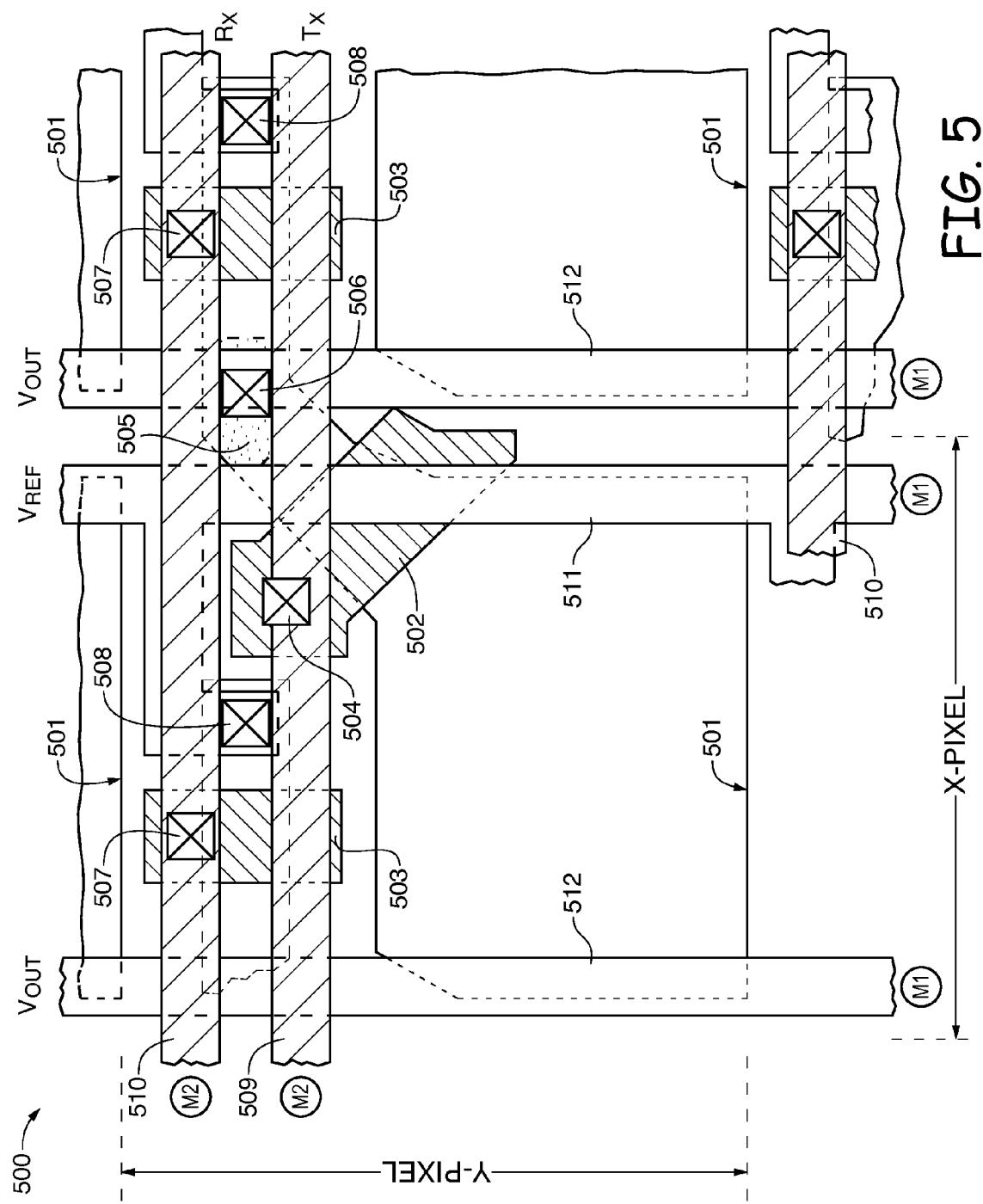

FIG. 5 shows the pixel floor plan of FIG. 4 with metal interconnects. As shown in drawing 500, active region 501 corresponds to the same active region 401 of FIG. 4. Similarly, polysilicon gates 502 and 503 correspond to the same transfer gate 402 and reset gate 403. Contact region 504 provides the opening for the via that connects transfer gate 502 to transfer gate metal bus 509. Similarly, contact region 507 provides the opening for the via that connects reset gate 503 to reset gate metal bus 510. Metal buses 509 and 510 are formed in the second metal level (e.g., a second metal routing layer above a first metal routing layer), whereas the first metal level (i.e., the first metal routing layer) is used for reference voltage column bus line 511 and for output voltage column bus line 512.

The drain of the reset transistor may be connected to reference voltage bus line 511 through contact opening 508, whereas the source of the vertical SF transistor is connected to column bus line 512 via contact opening 506. Region 505 may correspond to region 405 of FIG. 4.

photo-diode Various embodiments have been described illustrating image sensor pixels with back-side-modulated vertical source follower transistors. The image sensors with back-side-modulated vertical transistors may be used to provide direct current photo-sensing capabilities and may be used in any electronic device.

The vertical back-gate-modulated transistor has several advantageous characteristics when used for the pixel source follower amplifier. The advantages include increased pixel fill factor, improved charge storage capacity (because more area can be dedicated to the photo-diode regions), reduced noise, reduced RST noise, and other improvements in performance.

The vertical back-gate-modulated source follower transistor may also be used to provide direct photo-diode current sensing without performing array scanning This is facilitated by using the substrate as the drain of the source follower transistor, which reduces the pixel wiring complexity and allows the pixel circuit to not be shared among multiple photo-diodes while maintaining high fill factor. Not sharing pixel circuitry among multiple photo-diodes improves the pixel light sensing symmetry, and the charge to voltage conversion factor, thereby increasing the pixel sensitivity and pixel performance.

The foregoing is merely illustrative of the principles of this invention which can be practiced in other embodiments.

What is claimed is:

1. An image sensor pixel circuit, comprising:
a photosensitive element; and
a transistor having a drain region, a source region, and a body region, wherein the body region serves as a floating diffusion region for the image sensor pixel circuit, wherein the source and drain regions have a first doping type, wherein the body region has a second doping type that is different than the first doping type, and wherein the body region is coupled to the photosensitive element.

2. The image sensor pixel circuit defined in claim 1 wherein the transistor comprises a p-channel transistor.

3. The image sensor pixel circuit defined in claim 2 wherein the transistor comprises a selected one of a p-channel metal-oxide-semiconductor transistor and a p-channel junction field-effect transistor.

4. The image sensor pixel circuit defined in claim 3 further comprising a reset transistor that is coupled between a power supply voltage source and the body region.

5. The image sensor pixel circuit defined in claim 4 further comprising a transfer gate coupled between the photosensitive element and the body region.

6. The image sensor pixel circuit defined in claim 5 wherein the photosensitive element comprises a pinned photo-diode.

7. The image sensor pixel circuit defined in claim 6 wherein the drain region of the transistor is coupled to a power supply terminal at a fixed potential, and wherein the source region of the transistor is coupled to an output line.

8. The image sensor pixel circuit defined in claim 7 wherein the transistor further comprises a gate coupled to the power supply terminal at the fixed potential.

9. The image sensor pixel circuit defined in claim 7 wherein the reset transistor has a first source-drain region that is coupled to the body region and a second source-drain region that is coupled to a line biased at a reference voltage.

10. The image sensor pixel circuit defined in claim 9 further comprising an address transistor coupled between the output line and the second source-drain region of the transistor.

11. The image sensor pixel circuit defined in claim 1 wherein the photosensitive element comprises one of a plurality of photosensitive elements coupled to the body region and wherein the body region of the transistor is shared among the plurality of photosensitive elements and receives charge from the plurality of photosensitive elements.

12. An image sensor pixel circuit, comprising:
a photosensitive element; and
a vertical transistor having a body region that serves as a floating diffusion region; and
a transfer gate that is interposed between the body region and the photosensitive element to control transfer of accumulated charge from the photosensitive element to the floating diffusion region.

13. The image sensor pixel circuit defined in claim 12 wherein the vertical transistor has a first source-drain region that is coupled to a terminal at a fixed voltage and has a second source-drain region that is coupled to an output line.

14. The image sensor pixel circuit defined in claim 12 wherein the vertical transistor has a gate that is coupled to the terminal at the fixed voltage.

15. Image sensor pixel circuit defined in claim 14 wherein the vertical transistor comprises a buried vertical channel region controlled by the gate.

16. The image sensor pixel circuit defined in claim 15 further comprising a gate insulator interposed between the gate and the buried vertical channel region, wherein the gate insulator comprises shallow trench isolation structures.

17. The image sensor pixel defined in claim 16 wherein the photosensitive element comprises a pinned photo-diode.

18. An image sensor array, comprising:
a plurality of image sensor pixel circuits arranged in rows and columns; and
a plurality of output lines each of which runs parallel to an associated one of the columns, wherein each image sensor pixel circuit includes a photosensitive element and a vertical transistor having a body region coupled to the photosensitive element.

19. The image sensor array defined in claim 18 wherein the vertical transistors for the image sensor pixel circuits of each column comprise:
a buried doped region that serves as a first source-drain region for that vertical transistor and that is coupled to a terminal at a fixed voltage; and
a unburied doped region that serves as a second source-drain region for that vertical transistor and that is coupled to the output line associated with that column.

20. The image sensor array defined in claim 19 further comprising a transfer gate associated with each of the image sensor pixel circuits, wherein each of the vertical transistor body regions serves as a floating diffusion to which accumulated charge is transferred from the photosensitive element in that image sensor pixel circuit.

21. The image sensor array defined in claim 20 further comprising an address transistor in each image sensor pixel circuit that is coupled between one of the output lines and the second source-drain region of the vertical transistor in that image sensor pixel circuit, wherein the photosensitive elements comprise pinned photo-diodes.

* * * * *